United States Patent [19]
Nolan et al.

[11] Patent Number: 6,052,035
[45] Date of Patent: Apr. 18, 2000

[54] OSCILLATOR WITH CLOCK OUTPUT INHIBITION CONTROL

[75] Inventors: James B. Nolan, Chandler; Ryan Scott Ellison, Mesa; Michael S. Pyska, Phoenix, all of Ariz.

[73] Assignee: Microchip Technology Incorporated, Chandler, Ariz.

[21] Appl. No.: 09/205,758

[22] Filed: Dec. 4, 1998

Related U.S. Application Data

[63] Continuation-in-part of application No. 09/044,361, Mar. 19, 1998.

[51] Int. Cl.[7] ................................................. H03K 3/023
[52] U.S. Cl. ............................ 331/74; 331/111; 331/143; 331/179
[58] Field of Search .................................... 331/111, 143, 331/176, 179, 74, 75

[56] References Cited

U.S. PATENT DOCUMENTS

| | | | |
|---|---|---|---|
| 3,725,681 | 4/1973 | Frederiksen | 331/111 |
| 4,365,203 | 12/1982 | DiMassimo et al. | 327/143 |
| 5,294,894 | 3/1994 | Gebara | 331/1 A |
| 5,483,204 | 1/1996 | Tanoi | 331/14 |
| 5,760,655 | 6/1998 | Roohparvar | 331/111 |
| 5,870,345 | 2/1999 | Stecker | 331/111 |

Primary Examiner—Siegfried H. Grimm
Attorney, Agent, or Firm—Ronald L. Chichester; Paul N. Katz; Frohwitter

[57] ABSTRACT

An oscillator with temperature compensation produces a stable clock frequency over wide variations of ambient temperature, and it includes an oscillation generator, two independent current generators, a transition detector and a clock inhibitor. The outputs of the two programmable, independent current generators are combined to provide a capacitor charging current that is independent of temperature. The oscillator is capable of three modes of operation: fast mode, slow/low power mode and sleep mode, which are controlled by the transition detector in response to external control signals. When the transition detector transitions from one mode to another, it controls the clock inhibitor to block a clock output of the oscillator generator for a predetermined number of clock cycles to allow the clock output to stabilize. The oscillator is implemented on a single, monolithic integrated circuit.

9 Claims, 6 Drawing Sheets

OSCILLATOR WITH CLOCK OUTPUT INHIBITION CONTROL

RELATED APPLICATIONS

This application is a continuation-in-part of U.S. patent application Ser. No. 09/044,361, filed Mar. 19, 1998, entitled "A Precision Relaxation Oscillator With Temperature Compensation," which is assigned to the same assignee as the present application and for which there was at least one common inventor with the present application. U.S. patent application Ser. No. 09/044,361, filed Mar. 19, 1998, is incorporated by reference.

BACKGROUND OF THE INVENTION

1. Field of the Invention

This invention relates generally to integrated circuits which produce clock frequencies. Specifically, the present invention is a precision relaxation oscillator that produces a stable clock frequency over wide variations of ambient temperature, fabrication process and voltage. The invention is implemented on a single, monolithic integrated circuit. Also, the precision relaxation oscillator is capable of several modes of operation.

2. Description of the Prior Art

The current state of the art describes RC relaxation oscillators which primarily depend on one of two schemes. In the first example as found in FIG. 1, a single comparator is coupled to a pulse generator to alternately charge and discharge a capacitor to produce a clock for a "D type" flip-flop. Several error sources are present in this design. The resistor and capacitor typically have unpredictable voltage and temperature coefficients. The charging current and comparator input slew are a function of the supply voltage which is also subject to drift. Also, the pulse generator output may vary with temperature and supply voltage. These factors lead to a clock frequency that varies over temperature.

Figure 1:
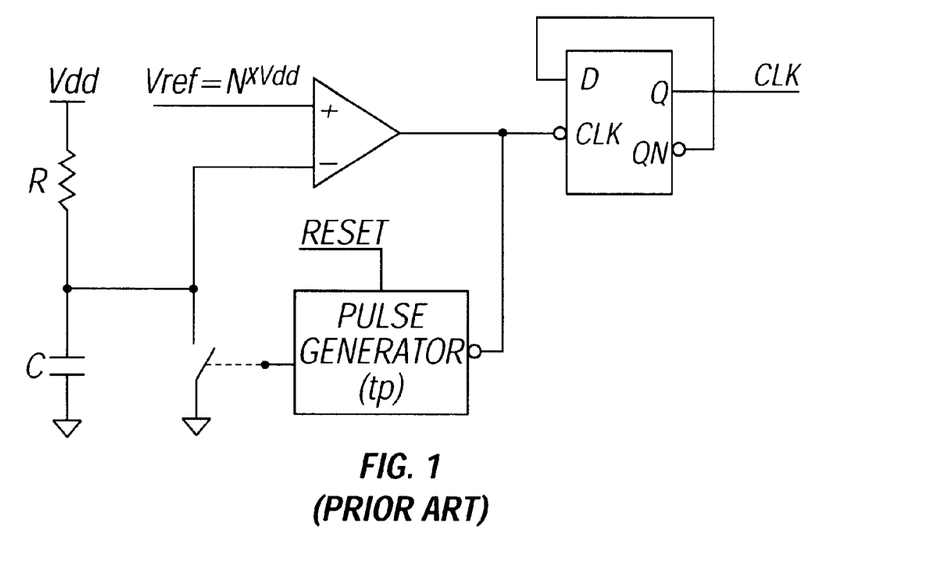
FIG. 1 is a schematic diagram of the prior art showing a simple RC Relaxation Oscillator with a pulse generator.
Figure 2:
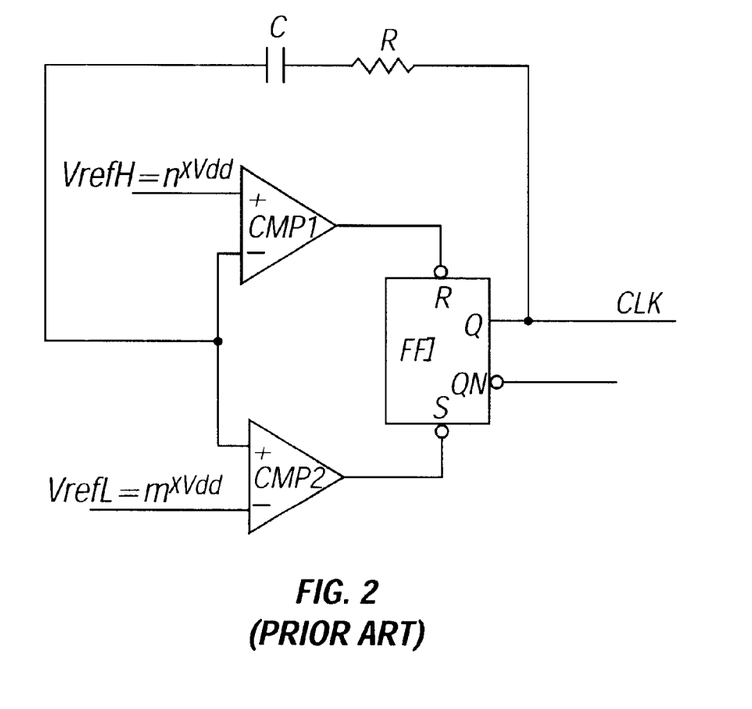
FIG. 2 is a schematic diagram of the prior art showing a dual comparator RC Relaxation Oscillator.

In a second example as illustrated in FIG. 2, an RC circuit provides a common input to each of two comparators. Independent reference voltages are coupled to each of the remaining inputs of the comparators. The outputs of each of the two comparators are coupled to the inputs of a "Set-Reset type" flip-flop. The output of the flip-flop serves to alternately charge and discharge the capacitor. Although this circuit eliminates the inaccuracies of the pulse generator as discussed above in FIG. 1, other problems manifest themselves. A duty cycle error may occur since it is unlikely that the capacitor will charge and discharge at the same rate, especially over temperature variations. Also, error is induced by the difficulty of providing two reference voltages which track each other coincidently over temperature.

Therefore, a need existed to provide a relaxation oscillator which is capable of maintaining a stable clock frequency independent of temperature.

SUMMARY OF THE INVENTION

It is an object of the present invention to provide a relaxation oscillator which is capable of maintaining a stable clock frequency independent of temperature. A stable clock is defined as one which maintains a stable frequency in an environment which is subject to temperature fluctuations.

It is another object of the present invention to provide a relaxation oscillator which minimizes the temperature coefficient of the oscillator as measured in parts per million of the clock frequency divided by temperature (ppm/dgc C.). For example, one part per million per degree centigrade for a clock frequency of 4 MHz equates to 4 clock cycles.

It is another object of the present invention to provide a relaxation oscillator which is immune to frequency drift due to process and supply voltage.

It is another object of the present invention to provide three modes of operation which include a fast mode, a slow/low power mode and a sleep mode.

It is another object of the present invention to reduce the power consumption when operating in the slow mode and the sleep mode.

In accordance with one embodiment of the present invention, a precision relaxation oscillator that produces a stable clock frequency over wide variations of ambient temperature is disclosed. The precision relaxation oscillator is comprised of an oscillation generator, a first current generator for producing a first output current and a second current generator for producing a second output current. The invention is implemented on a single, monolithic integrated circuit.

In accordance with another embodiment of the present invention an external resistor may be coupled to either the first or second current generators to produce the respective output currents required for determining the clock frequency.

In accordance with another embodiment of the invention a plurality of internal resistors within the first and second current generators are provided which are used to select the clock speed of the oscillator.

In accordance with another embodiment of the invention a transition detector circuit is provided.

In accordance with another embodiment of the present invention a clock inhibiter coupled to the output of the oscillation generator is provided.

The foregoing and other objects, features, and advantages of the invention will be apparent from the following, more particular description of the preferred embodiments of the invention, as illustrated in the accompanying drawings.

DETAILED DESCRIPTION OF THE PREFERRED EMBODIMENT

Figure 3:
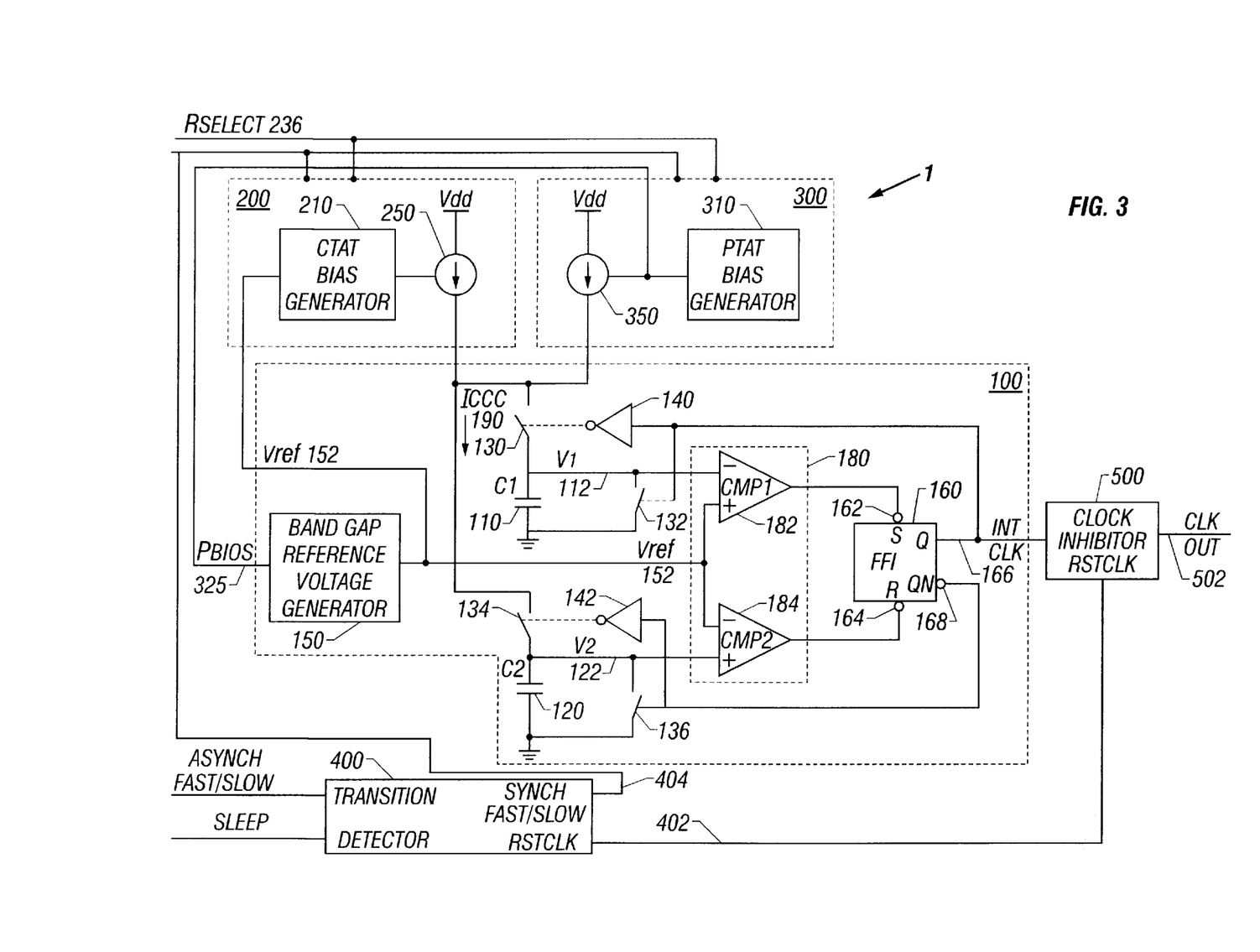
FIG. 3 is a block diagram of the present invention.

Referring to FIG. 3, a precision relaxation oscillator 1 that produces a stable clock frequency over wide variations of ambient temperature is shown. Preferably, the precision relaxation oscillator 1 produces a stable clock frequency in the range of approximately 1 KHz to 8 MHz. However, those skilled in the art will recognize that the present invention is not limited to a specific frequency range.

The precision relaxation oscillator 1 is capable of 3 modes. The first mode is the fast mode and is the normal operating mode. The second mode is the slow mode and is selected to conserve power, yet to have some functions of the circuit to which the precision relaxation oscillator 1 serves, remain active. The third mode is the sleep mode. In this mode, the precision relaxation oscillator 1 is inactive and there is no clock output, nor is there any power consumption. The transition between modes may occur "on the fly," i.e. suspension of processing activity by the CPU is not required for transitioning from one mode to another. However, in the preferred embodiment, the CPU or microcontroller will have completed the current instruction cycle before switching modes.

The precision relaxation oscillator 1 is comprised of an oscillation generator 100, a first current generator 200 which is typically a Complementary to Absolute Temperature (CTAT) current generator, a second current generator 300 which is typically a Proportional to Absolute Temperature (PTAT) current generator, a transition detector 400 and a clock inhibiter 500. In the preferred embodiment of the present invention, the precision relaxation oscillator 1 is implemented on a single, monolithic integrated circuit.

The CTAT 200 and PTAT 300 current generators are independently implemented and yield several important functions to the present invention. The CTAT 200 and PTAT 300 current generators compensate for the effects that temperature variation has on the internal components of the device such as resistors, capacitors and comparators by providing offsetting currents CTAT current 220 and PTAT current 320, i.e. currents with opposite slopes with respect to temperature. CTAT current 290 and PTAT current 390 (FIGS. 4 & 5) are combined to form a capacitor charging current $I_{CCC}$ 190 ($I_{CCC}$ 190=CTAT current 290+PTAT current 390). The combining, or summing of the CTAT current 290 and PTAT current 390 occurs when introduced to the oscillation generator 100 for charging a first capacitor 110 and a second capacitor 120. Because the CTAT 290 and PTAT 390 currents are approximately linear and of opposite slope with respect to temperature, the result of the summation is an $I_{CCC}$ 190 that is nearly independent of temperature.

In the preferred embodiment, the oscillation generator 100 is comprised of a set-reset flip-flop 160, a comparator circuit 180 further comprised of two comparators 182 & 184, two capacitors 110 & 120, four transistor switches 130, 132, 134 & 136, two inverters 140 & 142 and a bandgap reference voltage circuit 150 for producing a reference voltage 152.

The transistor switches 130 & 134 provide charging paths for the capacitors 110 & 120, respectively. The transistor switches 132 & 136 provide discharging paths for the capacitors 110 & 120, respectively. In the preferred embodiment, the transistor switches 130, 132, 134 and 136 are MOSFET transistors, however, those skilled in the art will recognize that the invention is not limited to this technology.

The oscillation generator 100 operates by having one capacitor charge while the other capacitor discharges. The discharge path for the capacitor 110 is connected via transistor switch 132 to an input of the comparator 182. The discharge path for the capacitor 120 is connected via transistor switch 136 to an input of the comparator 184.

In the preferred embodiment and for best performance, a stable reference voltage source such as a bandgap reference voltage circuit 150 is used. The bandgap reference voltage circuit 150 provides a single reference voltage 152, which is connected to second inputs of comparators 182 & 184, and is used to set the common mode voltage at each comparator 182 & 184 and at the CTAT current generator 200. The $P_{BIAS}$ input 325 for the bandgap reference voltage circuit 150 is an output of the PTAT bias generator 310 which is described below. The bandgap reference voltage circuit 150 has the advantage of stabilizing capacitor charging current and minimizing the error due to variance in comparator input slew and propagation delay.

Furthermore, in order to cancel, or at the very least minimize, the effects of reference voltage drift, the CTAT 200 current generator relies on the same reference voltage 152 as the comparators 182 & 184. For example, if the reference voltage 152 increases, the CTAT current 290 (FIG. 4), which is equal to $V_{REF}/R$, also increases. Without compensation elsewhere, this increased CTAT current 290 would result in a faster clock frequency 166, because a greater $I_{CCC}$ 190 is produced, which results in faster charging of the capacitors 110 and 120. However, the capacitors 110 and 120 must charge to a greater level for the comparators 182 and 184 to trip with respect to the increased reference voltage 152. Thus, the present invention requires a simpler, less costly reference voltage source to achieve clock frequency stability. There are various embodiments of the bandgap reference voltage circuit 150, as well as other reference voltage sources such as voltage dividers, which are well known to those skilled in the art. However, the novel way in which the bandgap reference voltage circuit 150 is implemented in the present invention is not disclosed by the prior art.

The output of comparator 182 is connected to the set input 162 of the flip-flop 160. The output of comparator 184 is connected to the reset input 164 of the flip-flop 160. Thus, as the capacitors 110 and 120 alternatively charge and discharge, the outputs of the comparators 182 & 184 alternatively set and reset the flip-flop 160 thus producing a clock output.

The Q output 166 of the flip-flop 160 provides a stable clock frequency INTCLK that is independent of temperature variation. In the preferred embodiment, the Q output 166 is also routed to transistor switch 132 and via inverter 140 to transistor switch 130. Thus the Q output 166 provides the signal that controls the transistor switches 130 & 132 which in turn open and close the charging and discharging paths for capacitor 110.

The complementary Q output 168 of flip-flop 160 provides a second stable clock frequency that is also independent of temperature and the complement of Q output 166. The complementary Q output 168 is routed to transistor switch 136 and via inverter 142 to transistor switch 134. Thus the complementary Q output 168 provides the signal that controls the transistor switches 134 & 136 which in turn open and close the charging and discharging paths for capacitor 120.

The transition detector 400 performs two primary functions: converting an asynchronous fast/slow signal (ASYNCH FAST/SLOW) to a synchronous fast/slow signal (SYNCH FAST/SLOW 404) and initializing the clock inhibiter 500. The purpose of the clock inhibiter 500 is to inhibit INTCLK 166 from being output as CLKOUT 502 for a programmable number of clock cycles during mode transition when the INTCLK 166 may be unstable. When the circuit 1 transitions from one operating mode to another, e.g. from slow mode to fast mode, the transition detector 400, which is comprised of simple combinational and sequential logic such as a synchronous one-shot, sends a RSTCLK 402 signal to initialize the clock inhibiter 500.

Upon receiving the RSTCLK 402 signal from the transition detector 400, the clock inhibiter 500, which may be a simple programmable counter, will inhibit CLKOUT 502 from being sent to the connected circuitry, e.g. the CPU, for a predetermined number of clock cycles. Thus, the clock inhibiter 500 serves to prevent logic anomalies as a result of an unstable clock frequency or a clock frequency in transition. After a predetermined number of clock cycles following mode transition, when presumptively the operation of the precision relaxation oscillator 1 is stable, the clock inhibiter 500 will allow the CLKOUT 502 to pass to the connected circuitry.

Furthermore, the trailing edge of the RSTCLK 402 signal triggers the SYNCH FAST/SLOW 404 signal. The SYNCH FAST/SLOW 402 is used by the CTAT current generator 200 and PTAT current generator 300 to adjust the respective currents 290 and 390 for fast or slow mode operation, as described below.

Figure 4:
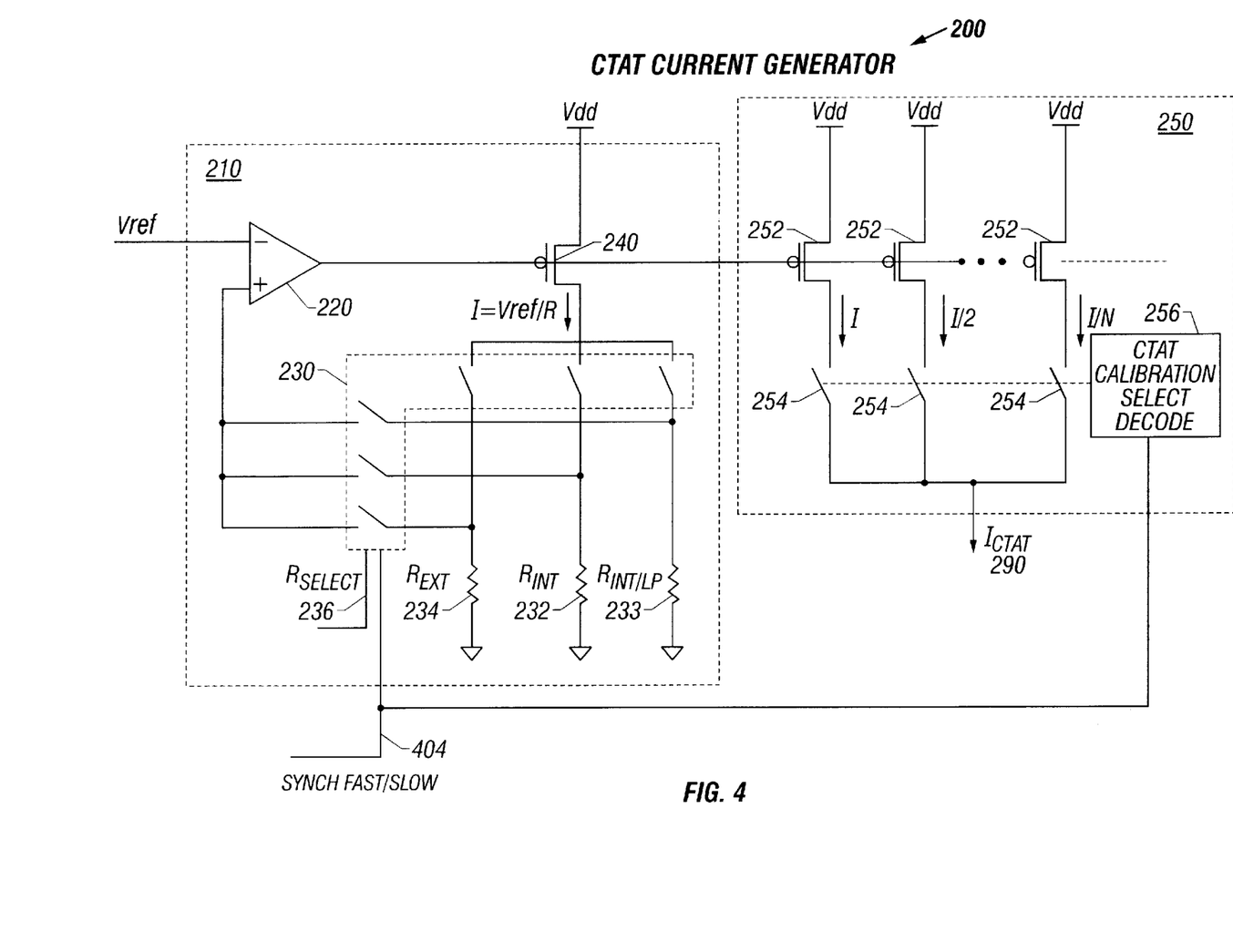
FIG. 4 is a block diagram of the CTAT current generator found in the present invention.

Referring to FIG. 4, wherein like numerals reflect like elements, the CTAT current generator 200 is comprised of a CTAT bias generator 210 and a current mirror 250 for producing the CTAT current 290. The CTAT bias generator 210 is comprised of an amplifier circuit 220, at least one resistor 232, 233 & 234 with a small positive temperature coefficient for regulating the input current to the amplifier and a transistor 240 for providing an input current to the amplifier 220. The amplifier 220 is a cascode configuration for supply and noise rejection. The reference voltage 152 is coupled to an input of the amplifier 220.

The different resistors 232, 233 & 234, which vary in impedance, are for controlling the current sent to the current mirror 250 and thus, determine the specific stable clock frequency independent of temperature which is produced by the oscillation generator 100. The present invention provides for selection logic 230 which inputs SYNCH FAST/SLOW 404 and a resistor select ($R_{SELECT}$ 236) for selecting one of the three resistors 232, 233 or 234. If the slow mode is activated by SYNCH FAST/SLOW 404, then the internal resistor $R_{INT/LP}$ 233 is selected. If the fast mode is activated by SYNCH FAST/SLOW 404 then the selection logic 230 considers the input $R_{SELECT}$ 236 in choosing as between the internal resistor $R_{INT}$ 232 and the external resistor $R_{EXT}$ 234.

In the preferred embodiment, the fast mode internal resistor 232 is fabricated from polysilicon technology which provides for low impedance and thus, higher current which in turn provides for a faster clock. In addition, polysilicon technology has a low temperature coefficient (ppm/dgc C.), thus providing improved frequency stability over temperature.

By contrast, the slow mode internal resistor 233 is preferably fabricated from doped silicon substrate, typically either through implantation and/or diffusion, e.g. Lightly Doped Drain (LDD). Doped silicon produces a high impedance which in turn reduces the current to the current mirror 250, and thus allows for operating at low power.

The slow mode internal resistor 233 could be fabricated using polysilicon technology. However, the resistance per unit area of polysilicon is significantly lower than the resistance per unit area of doped silicon. Thus, a polysilicon resistor would require significantly greater semiconductor area than a doped silicon resistor for a similar resistance. The power consumption of the precision relaxation oscillator 1 in typical applications ranges from 250 ua (micro amperes) in the fast mode to 20 ua or less in the slow mode. No power is consumed when in the sleep mode.

The current mirror 250 is comprised of a plurality of transistors 252 from one to n. The output the CTAT bias generator amplifier 220 is coupled to the current mirror transistors 252. Trimming the CTAT current 290 for achieving the proper CTAT:PTAT balance is programmed digitally by selecting or enabling one or more of the current mirror transistors 252 via the calibration switches 254, which would sum, to obtain the desired CTAT current 290.

The calibration switches 254 are also coupled the SYNCH FAST/SLOW 404 signal via the CTAT calibration select decode 256. In the fast mode, the calibration switches 254 are configured to trim $I_{CTAT}$ for a fast clock. In the slow mode, the calibration switches 254 may require a different configuration to trim $I_{CTAT}$ for a slow clock. Thus, the calibration switches 254 toggle between a fast mode calibration and a slow mode calibration in response to the state of the SYNCH FAST/SLOW 404 signal.

In the preferred embodiment, the current mirror 250 acts as a current divider which is well known to those skilled in the art. In other embodiments the current mirror 250 may be configured as a current multiplier. The CTAT current 290 is the sum of the selected outputs from the current mirror transistors 252.

Figure 5:
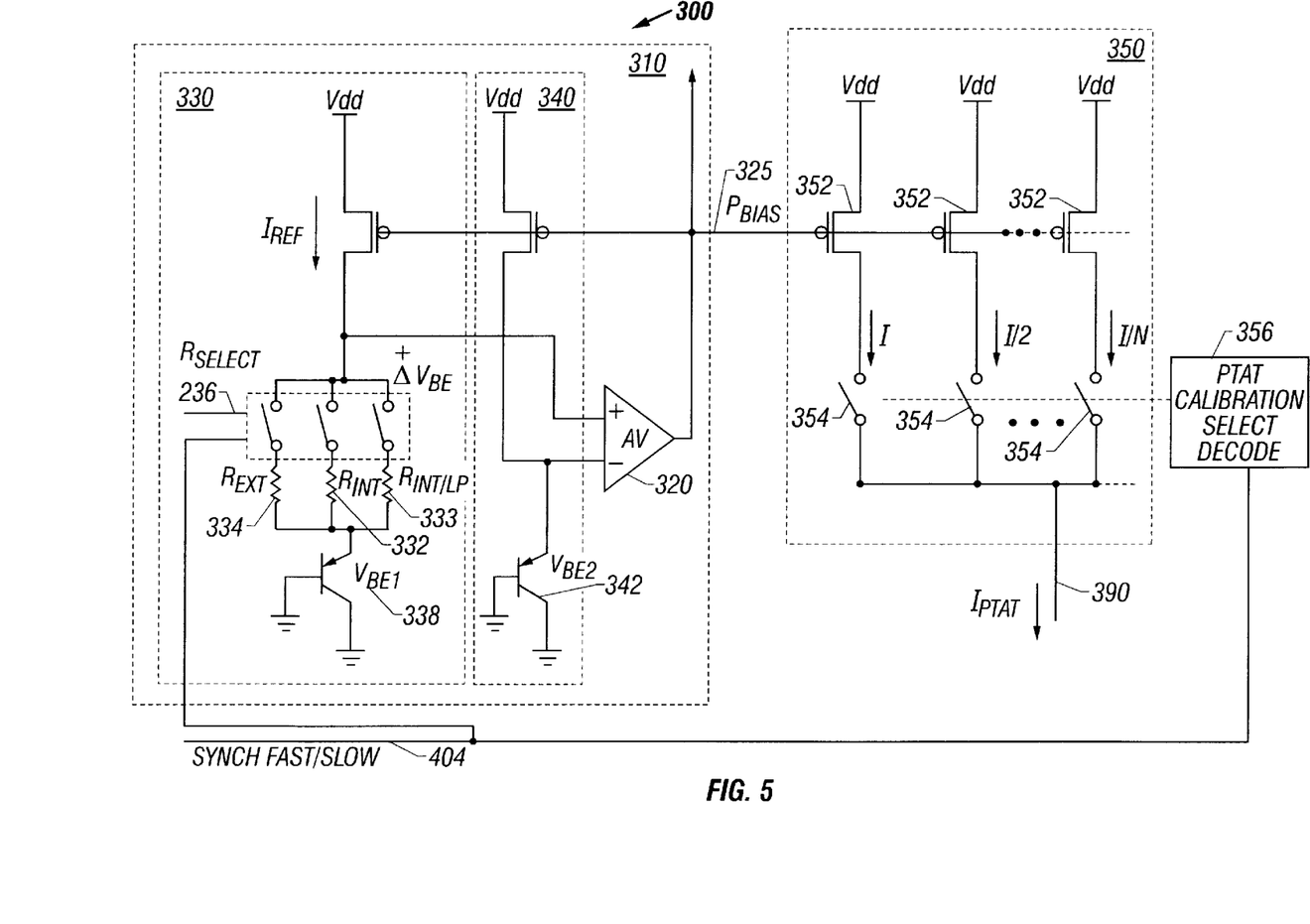
FIG. 5 is a block diagram of the PTAT current generator found in the present invention.

Referring to FIG. 5, wherein like numerals reflect like elements, the PTAT current generator 300, known to those skilled in the art as a $\Delta V_{BE}$ circuit, is comprised of PTAT bias generator 310 and a PTAT current mirror 350 for producing a PTAT current 390. The PTAT bias generator 310 is comprised of an amplifier circuit 320, a first bias circuit 330 for producing a first bias voltage across a selectable resistor with a small linear temperature coefficient 332, 333 and 334 and a second bias circuit 340 for producing a second bias voltage. The first and second bias voltages provide the inputs to the amplifier 320. The output of the amplifier 320 is $P_{BIAS}$ 325 which is coupled to the first 330 and second 340 bias circuits, the PTAT current mirror 350 and the bandgap reference voltage generator 150 (FIG. 1).

The different resistors 332, 333 and 334, which vary in impedance, are for controlling the current sent to the current mirror 350 and thus, determine the specific stable clock frequency independent of temperature which is produced by the oscillation generator 100.

Similar to the CTAT bias generator 210, the PTAT bias generator 310 provides for selection logic 330 which inputs SYNCH FAST/SLOW 404 and the resistor select ($R_{SELECT}$ 236) for selecting one of the three resistors 332, 333 or 334. If the slow mode is activated by SYNCH FAST/SLOW 404, then the internal resistor $R_{INT/LP}$ 333 is selected. If the fast mode is activated by SYNCH FAST/SLOW 404, then the selection logic 330 considers the input $R_{SELECT}$ 336 in choosing as between the internal resistor $R_{INT}$ 332 and the external resistor $R_{EXT}$ 334.

In the preferred embodiment, the fast mode internal resistor 332 is fabricated from polysilicon technology which provides for low impedance and thus, higher current which in turn provides for a faster clock. In addition, polysilicon technology has a low temperature coefficient (ppm/dgc C.), thus providing improved frequency stability over temperature.

By contrast, the slow mode internal resistor 333 is preferably fabricated from diffused technology, e.g. Lightly Doped Drain (LDD). Diffused technology produces a high impedance which in turn reduces the current to the current mirror 350, and thus allows for operating at low power. The respective resistor pairs in the CTAT and PTAT bias generators 210 and 310 are matched to each other for optimum stability, e.g. both resistors ($R_{EXT}$ 234 and 334 or $R_{INT}$ 232 and 332) are polysilicon in the fast mode and both resistors ($R_{INT/LP}$ 233 and 333) are doped silicon in the slow mode.

The slow mode internal resistor 333 could be fabricated using polysilicon technology. However, the resistance per unit area of polysilicon is significantly lower than the resistance per unit area of diffused technology. Thus, a polysilicon resistor would require significantly greater semiconductor area than a doped silicon resistor for a similar resistance.

The PTAT current mirror 350 is comprised of a plurality of transistors 352 from one to n. Trimming is performed digitally by programming the selection or enablement of one or more of the current mirror transistors 352 via the calibration switches 354 to obtain the desired PTAT current 390.

The calibration switches 354 are also coupled to the SYNCH FAST/SLOW 404 signal via the PTAT calibration select decode 356. In the fast mode, the calibration switches 354 are configured to trim $I_{PTAT}$ for a fast clock. In the slow mode, the calibration switches 354 may require a different configuration to trim $I_{PTAT}$ for a slow clock. Thus, the calibration switches 354 toggle between a fast mode calibration and a slow mode calibration in response to the state of the SYNCH FAST/SLOW 404 signal.

In the preferred embodiment, the current mirror 350 acts as a current divider which is well known to those skilled in the art. In other embodiments the current mirror 350 may be configured as a current multiplier. The PTAT current 390 is the sum of the selected outputs from the current mirror transistors 352.

Figure 6:
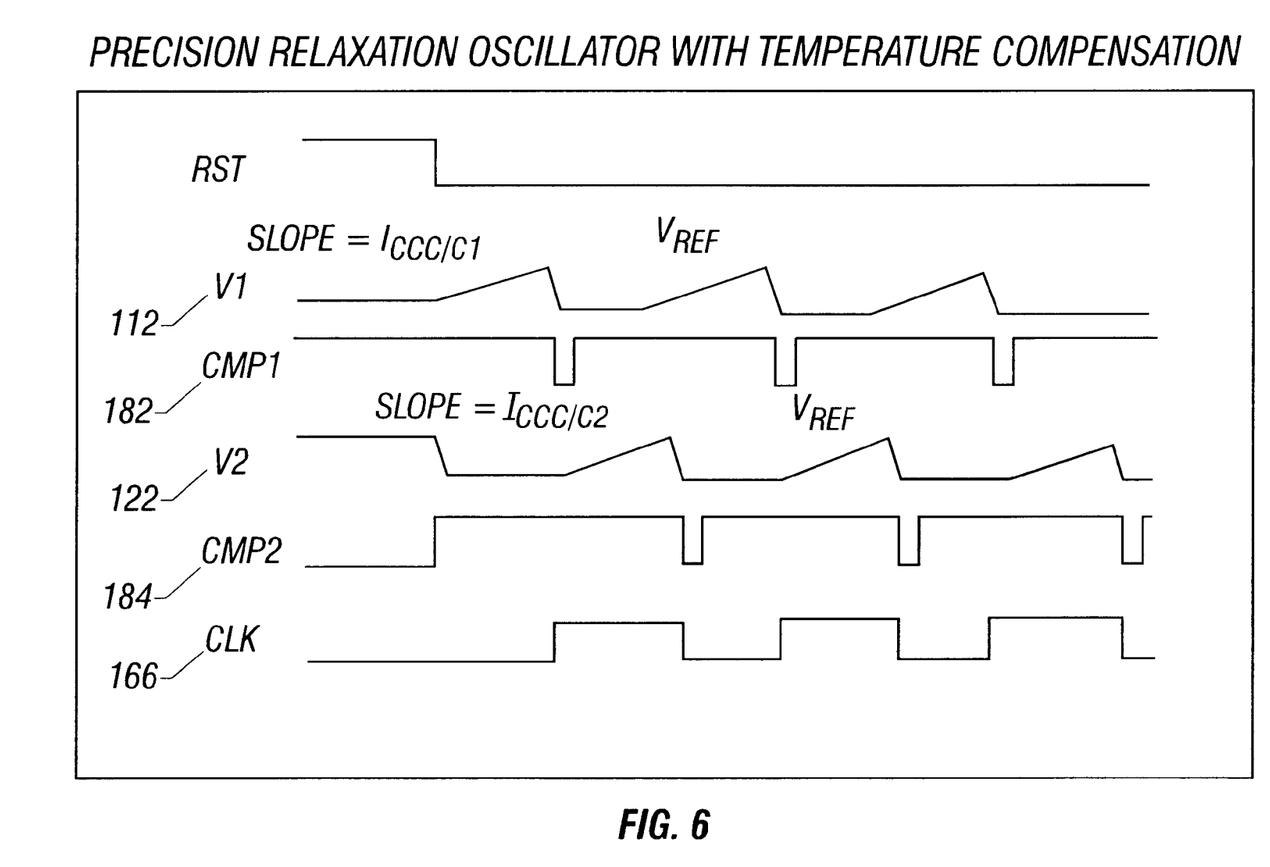
FIG. 6 is a timing diagram of specific parameters of the present invention.

Referring to FIG. 6, wherein like numerals reflect like elements, a general timing diagram (i.e. not mode dependent) for the relaxation oscillator 1 is shown. V1 112 reflects the charging and discharging of capacitor 110 (FIG. 1). Note that the positive slope (charging) of V1 112 is equal to $I_{CCC}$ 190 divided by the capacitance of capacitor 110. The maximum amplitude of V1 112 is equal to the reference voltage 152. CMP1 reflects the output of the comparator 182 which is coupled to the set input 162 of the flip-flop 160.

V2 122 reflects the charging and discharging of capacitor 120. In this case the positive slope of V2 122 is equal to $I_{CCC}$ 190 divided by the capacitance of capacitor 120. CMP2 reflects the output of the comparator 184 which is coupled to the reset input 164 of the flip-flop 160. CLK is the Q output 166 of the flip-flop 160.

For a 50 percent duty cycle, the values of capacitors 110 & 120 are identical which result in similar slopes for V1 112 and V2 122. As the capacitor voltage exceeds the reference voltage 152, the respective comparator 182 & 184 pulses low which causes the flip-flop 160 to change state. RST (reset) is used to initialize the comparators 182 & 184 and the flip-flop 160 to a known state.

Figure 7:
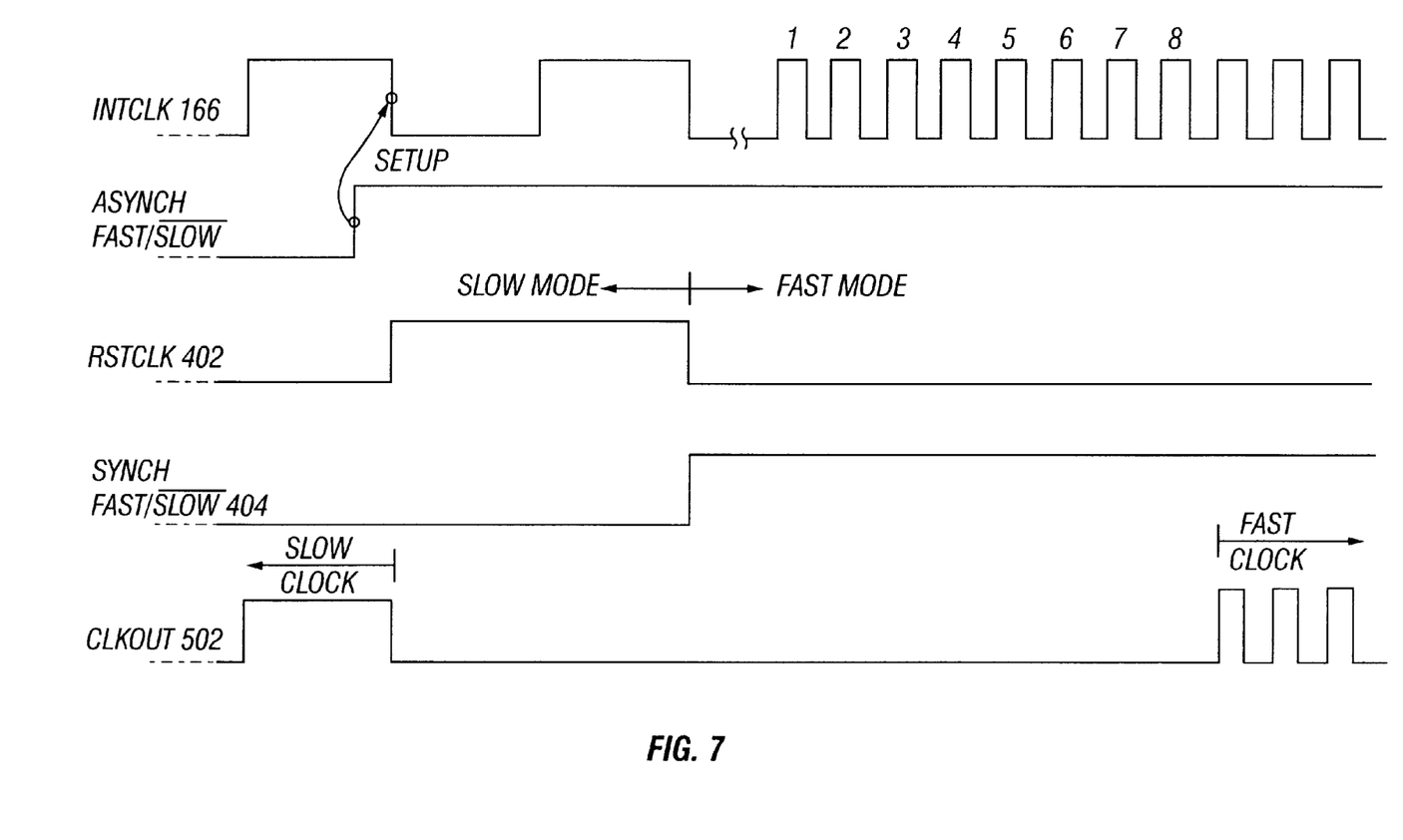
FIG. 7 is a timing diagram of the clock transition between slow mode and fast mode.

Referring to FIG. 7, wherein like numerals reflect like elements, a timing diagram which illustrates the transition from slow mode to fast mode of the embodiment of FIG. 3 is shown. The relaxation oscillator 1 would operate similarly when transitioning from fast mode to slow mode.

In the timing diagram, the relaxation oscillator 1 (FIG. 3) is first operating in the slow mode. The ASYNCH FAST/SLOW signal, which is generated external to the present invention, is received by the transition detector 400. In the preferred embodiment, logic level zero indicates slow mode and logic level one indicates fast mode. The signal to transition to sleep mode is a separate, active high signal.

Upon receiving the ASYNCH FAST/SLOW signal, that meets the required setup time in relation to the internal clock INTCLK 166, to transition to the fast mode, the transition detector 400 generates two outputs. The transition detector 400 outputs a reset pulse RSTCLK 402 to the clock inhibiter 500. The transition detector 400 also synchronizes the ASYNCH FAST/SLOW signal and at the trailing edge of RSTCLK 402, the transition detector 400 outputs SYNCH FAST/SLOW 404 to the current generators 200 and 300. At this point the current generators 200 and 300 begin the switching to generate the currents required for the fast mode. As the current generators 200 and 300 begin their internal switching, several clock cycles are required to allow the bias currents to settle and for INTCLK 166 to stabilize.

Upon receiving RSTCLK 402, the clock inhibiter 500 immediately begins inhibiting CLKOUT 502. At the trailing edge of the RSTCLK 402 pulse, the relaxation oscillator 1 begins to transition from slow to fast mode. In one embodiment, the clock inhibiter counts and inhibits eight fast clock cycles of the INTCLK 166 for stabilization, before releasing the inhibit and allowing CLKOUT 502 to proceed with the fast mode clock.

The present invention minimizes clock frequency drift due to fabrication process, supply voltage and temperature variances. This is accomplished by providing offsetting bias currents which when summed are independent of temperature variation, trimming via the programmable current mirrors 250 & 350 to eliminate process variations, using a stable voltage reference such as a bandgap reference voltage circuit 150 and a dual capacitor, dual comparator oscillation generator 100. Also, analog design techniques, well known to those skilled in the art, such as component matching and cascode current sources enhance the stability of the circuit.

Although the invention has been particularly shown and described with reference to a preferred embodiment thereof, it will be understood by those skilled in the art that changes in form and detail may be made therein without departing from the spirit and scope of the invention.

What is claimed is:

1. An oscillator, comprising:
   a clock generator having an output, said clock generator generating a clock signal at said generator output;
   an inhibitor having a control input, a clock output, and a clock input coupled to said generator output, said inhibitor inhibiting the transmission of signals from said clock input to said clock output when receiving an activation signal at said control input; and
   a detector having an input and an output coupled to said inhibitor control input, said detector detecting an oscillator control signal at said detector input, thereby generating said activation signal at said detector output;
   wherein the clock generator comprises at least a timing capacitor and at least a first current generator for periodically charging said timing capacitor, said first current generator being constructed and arranged to selectively generate at least two different currents;
   wherein said clock generator is constructed and arranged to selectively generate a clock signal of at least two different clock frequencies;
   wherein the circuit has at least a first operating mode and a second operating mode, the clock frequency of the clock signal of the second operating mode being lower than the clock frequency of the clock signal of the first operating mode; and
   wherein the first operating mode is determined by the selection of a resistor which is internal to the first current generator.

2. The circuit in accordance with claim 1 wherein the first operating mode is further determined by programming a plurality of calibration switches which are internal to the first current generator.

3. An oscillator, comprising:

a clock generator having an output, said clock generator generating a clock signal at said generator output;

an inhibitor having a control input, a clock output, and a clock input coupled to said generator output, said inhibitor inhibiting the transmission of signals from said clock input to said clock output when receiving an activation signal at said control input; and a detector having an input and an output coupled to said inhibitor control input, said detector detecting an oscillator control signal at said detector input, thereby generating said activation signal at said detector output;

wherein the clock generator comprises at least a timing capacitor and at least a first current generator for periodically charging said timing capacitor, said first current generator being constructed and arranged to selectively generate at least two different currents;

wherein said clock generator is constructed and arranged to selectively generate a clock signal of at least two different clock frequencies;

wherein the circuit has at least a first operating mode and a second operating mode, the clock frequency of the clock signal of the second operating mode being lower than the clock frequency of the clock signal of the first operating mode; and wherein the second operating mode is determined by the selection of a second resistor which is internal to the first current generator.

4. The circuit in accordance with claim 3 wherein the second operating mode is further determined by programming a plurality of calibration switches which are internal to the first current generator.

5. An oscillator, comprising:

a clock generator having an output, said clock generator generating a clock signal at said generator output;

an inhibitor having a control input, a clock output, and a clock input coupled to said generator output, said inhibitor inhibiting the transmission of signals from said clock input to said clock output when receiving an activation signal at said control input; and a detector having an input and an output coupled to said inhibitor control input, said detector detecting an oscillator control signal at said detector input, thereby generating said activation signal at said detector output; and wherein said inhibitor comprises a counter.

6. The circuit in accordance with claim 5 wherein said counter starts counting clock pulses of said clock signal upon receiving said activation signal at said control input.

7. The circuit in accordance with claim 6 wherein said inhibitor inhibits the transmission of signals from said clock input to said clock output until said counter has counted a predetermined number of clock pulses.

8. The circuit in accordance with claim 7 wherein said inhibitor permits the transmission of signals from said clock input to said clock output after said counter has counted said predetermined number of clock pulses.

9. The circuit in accordance with claim 7 wherein said predetermined number of clock pulses is programmable.

* * * * *